United States Patent
Premakanthan et al.

(10) Patent No.: US 8,639,199 B1
(45) Date of Patent: *Jan. 28, 2014

(54) SYSTEM AND METHOD FOR HIGH PERFORMANCE COHERENT PEAK COMPRESSION ESTIMATION

(75) Inventors: Pravin Premakanthan, Chandler, AZ (US); Mahib Rahman, Chandler, AZ (US)

(73) Assignee: McAfee, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/594,616

(22) Filed: Aug. 24, 2012

(51) Int. Cl.
*H04B 1/04* (2006.01)
*H03G 3/30* (2006.01)
*H03F 1/32* (2006.01)

(52) U.S. Cl.
CPC ............ *H03G 3/3042* (2013.01); *H03F 1/3247* (2013.01)
USPC ..................... 455/126; 455/114.3; 455/115.1; 455/127.1

(58) Field of Classification Search
USPC .............. 455/114.3, 115.1, 126, 127.1, 127.2
See application file for complete search history.

(56) References Cited

U.S. PATENT DOCUMENTS

| | | | | |
|---|---|---|---|---|
| 5,170,495 A | * | 12/1992 | McNicol et al. | 455/116 |
| 5,675,286 A | * | 10/1997 | Baker et al. | 330/129 |
| 6,043,707 A | * | 3/2000 | Budnik | 330/10 |
| 6,731,694 B2 | * | 5/2004 | Bozeki et al. | 375/297 |
| 7,194,039 B2 | * | 3/2007 | Hunton | 375/260 |
| 7,197,286 B2 | * | 3/2007 | Ode et al. | 455/114.3 |
| 7,542,736 B2 | * | 6/2009 | Sarraf | 455/114.2 |
| 7,634,240 B2 | * | 12/2009 | Mitzlaff et al. | 455/127.3 |
| 8,185,065 B2 | * | 5/2012 | McCallister et al. | 455/114.2 |
| 8,340,604 B2 | * | 12/2012 | Drogi et al. | 455/114.3 |
| 8,433,263 B2 | * | 4/2013 | Pratt et al. | 455/126 |
| 8,463,207 B2 | * | 6/2013 | Pratt et al. | 455/126 |

* cited by examiner

*Primary Examiner* — Duc M Nguyen
(74) *Attorney, Agent, or Firm* — Baker Botts LLP.

(57) ABSTRACT

A system for estimating a peak compression of a wireless signal is disclosed. The system may include a reference signal generator configured to provide a reference signal, wherein the reference signal is associated with an ideally amplified and time aligned version of the wireless signal. The system may also include a gain error generator configured to provide a gain error signal, wherein the gain error signal is based at least on the reference signal and the wireless signal. Further, the system may also include a peak compression estimator configured to provide a compression detection flag based at least on the reference signal and the gain error signal.

21 Claims, 5 Drawing Sheets

SYSTEM AND METHOD FOR HIGH PERFORMANCE COHERENT PEAK COMPRESSION ESTIMATION

TECHNICAL FIELD

The present disclosure relates generally to wireless communication and, more particularly, to high performance coherent peak compression estimation.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

A transmitter in a wireless communication device may amplify a signal to be transmitted in order to effectively transmit the signal. However, such amplification may result in clipping of the transmitted signal. This clipping may lead to loss of the information represented by the transmitted signal. While feedback based on the actual clipping may be useful in some instances after the fact, it does not prevent information lost during the time period prior to feedback. Thus, for a wireless communication device that wishes to minimize information loss, it may be useful to identify the boundaries at which amplification may cause such information loss and preemptively prevent signal clipping.

SUMMARY

A system for estimating a peak compression of a wireless signal is disclosed. The system may include a reference signal generator configured to provide a reference signal, wherein the reference signal is associated with an ideally amplified and time aligned version of the wireless signal. The system may also include a gain error generator configured to provide a gain error signal, wherein the gain error signal is based at least on the reference signal and the wireless signal. Further, the system may also include a peak compression estimator configured to provide a compression detection flag based at least on the reference signal and the gain error signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
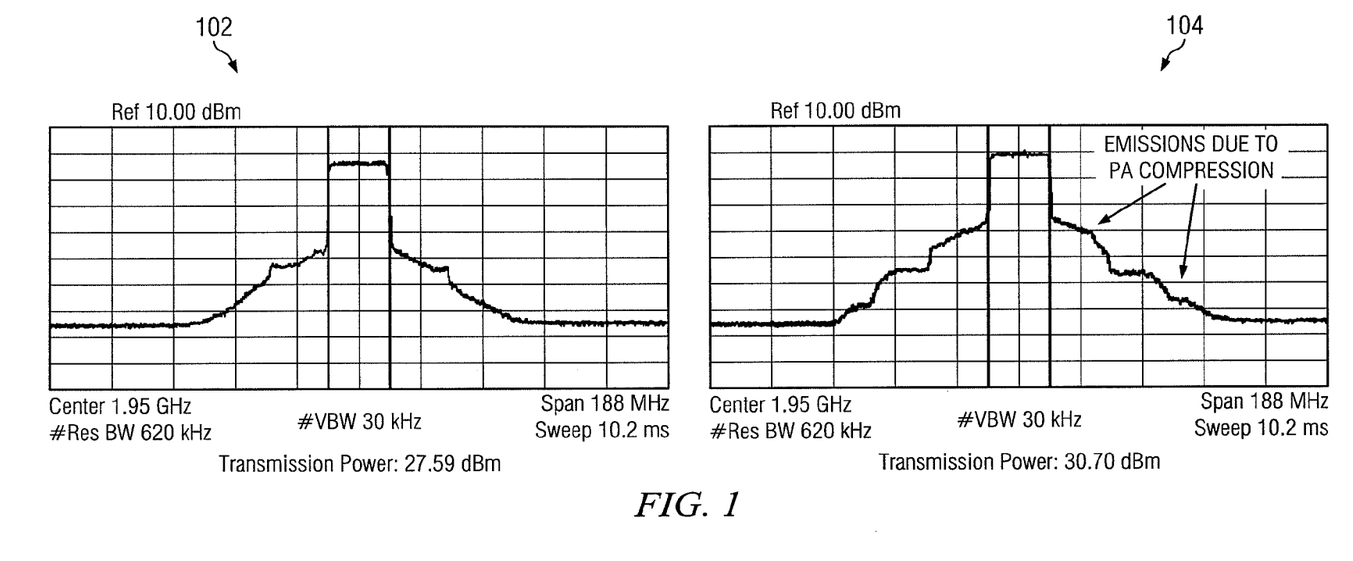
FIG. 1 illustrates a diagram of an example wireless signal at two levels of amplification, in accordance with certain embodiments of the present disclosure.

FIG. 1 illustrates a diagram 100 of an example wireless signal at two levels of amplification, in accordance with certain embodiments of the present disclosure. Diagram 100 illustrates a signal with a center frequency of 1.95 GHz. Diagram 100 charts the amplitude of the signal on the y-axis against frequency on the x-axis. Moderately amplified signal 102, shown on the left of diagram 100, illustrates the signal amplified to a peak transmission power of 27.59 dBm. Highly amplified signal 104, shown on the right of diagram 100, illustrates the same signal amplified to a peak transmission power of 30.70 dBm. Due to the higher amplification, a greater frequency range is amplified. In the illustrated example, points 106, 108 identify frequency emission points at higher-than-necessary power levels.

In certain situations, higher amplification of the greater frequency range may lead to an increase in noise transmitted rather than the desired signal. For example, the more powerful frequencies outside the desired range may degrade the close-in spurious emission mask as well as far out emissions, resulting in increased noise.

Some wireless communication devices may use certain techniques to mitigate the effects of the increased noise. One such technique is known as crest factor reduction ("CFR"). However, CFR techniques may require an accurate estimate of the peak compression amount at the antenna.

Figure 2:
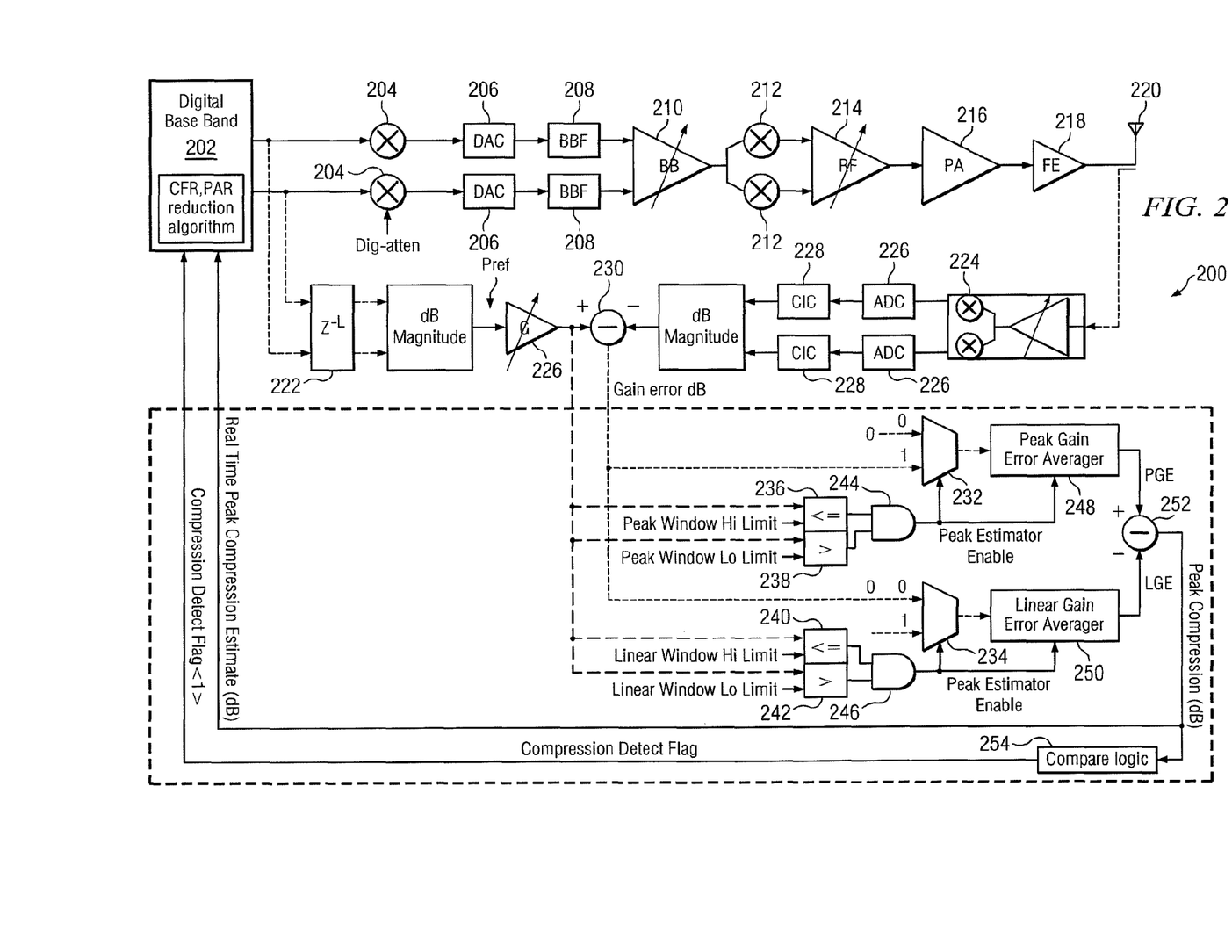
FIG. 2 illustrates a simplified circuit diagram of an example system for accurately, dynamically estimating the peak compression amount, in accordance with certain embodiments of the present disclosure.

FIG. 2 illustrates a simplified circuit diagram of an example system 200 for accurately, dynamically estimating the peak compression amount, in accordance with certain embodiments of the present disclosure. In some embodiments, system 200 may include baseband processor 202, one or more digital gain(s) 204, digital-to-analog converters 206, baseband filters 208, baseband gain amplifier 210, radio frequency ("RF") analog up-converters 212, RF gain control 214, power amplifier 216, front-end control 218, and antenna 220.

In some embodiments, baseband processor 202 may be any suitable processor configured to manage the radio functions of a wireless communication device. In some embodiments, baseband processor 202 may communicate a wireless signal to antenna 220 via multiple components. In the illustrative example provided, baseband processor 202 communicates the signal via quadrature amplitude modulation, resulting in communication of two channels: the i-channel and the q-channel. Each channel may then proceed through one or more digital gain amplifier(s) 204. Having been amplified, the signal may then be communicated to one or more digital-to-analog converter(s) 206. Digital-to-analog converter(s) 206 may be any suitable electronic device configured to convert the digital i- and/or q-channel signal into an analog signal. After conversion to analog, the signals may then be communicated to one or more baseband filter(s) 208. In some embodiments, baseband filter(s) 208 may be any suitable electronic component (or components) configured to filter the analog signals for the appropriate frequencies. In this manner, the signals may be shaped for optimized transmission.

After being filtered, the signals may then be communicated to one or more baseband gain amplifier(s) 210. In some embodiments, baseband gain amplifier(s) 210 may be any suitable electronic component (or components) configured to amplify the analog signal received. For example, baseband gain amplifier 210 may be a voltage follower circuit configured to amplify the analog signal. After amplification, the signal may then be communicated to one or more RF analog up-converter(s) 212. RF analog up-converter(s) 212 may be any suitable electronic component (or components) configured to convert the signal received into a signal of the appropriate radio frequency. For example, RF analog up-converter 212 may convert the signal into a 2 GHz signal.

After conversion, the signal may then be communicated to one or more RF gain control(s) 216. RF gain control(s) 216 may be any suitable electronic component (or components) configured to amplify the RF signal received. The signal may then be communicated to one or more power amplifier(s) 216. Power amplifier(s) 216 may be any suitable electronic component (or components) configured to amplify the power levels at which the signal may be transmitted. The signal may then be communicated to one or more front end control(s) 218. Front end control(s) may be any suitable electronic component (or components) configured to control other components of the wireless communication device. For example, front end control 218 may control an antenna switch or a signal multiplexer. In the illustrative example, front end control 218 may control the antenna switch associated with antenna 120.

Although certain components of system 200 are illustrated and described herein, it may be appreciated that more, fewer, or different components may be included in system 200 without departing from the scope of the present disclosure. Further, the simplified circuit diagram of system 200 illustrates one example configuration of system 200. Components may be combined into one or more physical components, depending on the particular configuration, without departing from the scope of the present disclosure. For example, in some configurations baseband filter 208 and baseband gain amplifier 210 may be present on one integrated circuit.

Components 104-120 illustrate a high-level circuit diagram of an example system for communicating a wireless signal from baseband processor 202 to antenna 220. For ease of illustration, this communication path may be referred to collectively as the "transmission chamber." This term is offered only to aid in understanding and is not intended to limit the scope of the present disclosure. In some embodiments, the transmission chamber may include more, fewer, or different components as described in more detail above. For example, in some embodiments, the transmission chamber may include an antenna tuner, which may be configured to dynamically adjust impedance matching values for antenna 220.

As described in more detail above with reference to FIG. 1, it may be necessary or desirable to dynamically, accurately estimate the peak compression as a result of the amplification described with reference to system 200. Accordingly, in some embodiments, system 200 may also include delay buffer 222, gain amplifier 226, summer 230, cascaded integrator-comb ("CIC") filter 228, analog-to-digital converter 226, and analog converter 224. In some embodiments, these components may be used to generate values for use in the estimate of peak compression, as described in further detail below and with reference to FIG. 3.

In some embodiments, delay buffer 222 may be any suitable electronic component (or components) configured to delay a signal. In operation of system 200, delay buffer 222 may be configured to delay the signal by an amount equal to the latency resulting from the communication of the signal through the transmission chamber described above. After delay, the signal may then be communicated to gain amplifier 226. In some embodiments, gain amplifier 226 may be any suitable electronic component (or components) configured to amplify the signal. In operation of system 200, gain amplifier 226 may be configured to amplify the signal in an amount equal to the combined gain that would be applied to the signal if it were to have continued through the transmission chamber as described in more detail above.

In some embodiments, the signal exiting the transmission chamber at front end control 218 may then be communicated to one or more analog converter(s) 224. Analog converter(s) 224 may be any suitable electronic component (or components) configured to convert the signal received into a lower frequency, lower power analog signal. In the illustrative example of system 200, analog converter 224 may be configured to convert the signal received from front end control 218 to the signal received by RF analog up-converter 212. Once converted, the signal may then be communicated to one or more analog-to-digital converter(s) 226 and one or more CIC filter(s) 228. Analog-to-digital converter(s) 226 may be any suitable electronic component (or components) configured to convert the analog signal received into a digital signal. CIC filter(s) 228 may be any suitable electronic component (or components) configured to interpolate the digital signal received. In some embodiments, the signal from gain amplifier 226 and CIC 228 may then be combined in summer 230 for additional processing.

In operation, for the purposes of peak compression estimation, the signal communicated by gain amplifier 226 to summer 230 may be considered a model of the ideal signal as it should have been communicated through the transmission chamber. Hereinafter, this signal may be referred to as the "reference signal." At summer 230, the reference signal may be compared to the signal received from CIC 228 to generate a signal reflecting the differences between the two signals. In the example system 200, this signal may represent the gain error present in the actual components of the transmission chamber. Hereinafter, the output of summer 230 may be referred to as the "gain error."

In some embodiments, system 200 may include one or more comparators, 236, 238, 240, 242; one or more logic circuits 244, 246, one or more multiplexers 232, 234, one or more averagers 248, 250, summer 252, and comparator 254.

In some embodiments, system 200 may compare the reference signal to a threshold value, Peak Window Hi limit, at comparator 236. If the reference signal is less than or equal to this threshold, comparator 236 may out put a logical value of one. System 200 may also compare the reference signal to a threshold value, Peak Window Lo limit, at comparator 238. If the reference signal is greater than the threshold, comparator 238 may output a logical value of one. The output of comparators 236, 238 may then be combined at logic circuit 244. In the illustrative example of system 200, logic circuit 244 is an AND gate. In operation, if the outputs of both comparators 236, 238 are a logical value of one, then logic circuit 244 may output a logical value of one.

The output of logic circuit 244 may then be communicated to multiplexer 232. At multiplexer 232, the output of logic circuit 244 may be used to multiplex a zero value with the gain error. In some embodiments, this may allow the designer of system 200 flexibility to pick a range of gain error to accommodate. The output of multiplexor 232 is then communicated to averager 248 along with the output of logic circuit 244. Averager 248 may then accumulate the average of the two signals over time. In some embodiments, this average may represent the peak gain error ("PGE"), as described in more detail below with reference to FIGS. 3-4. The PGE may then be communicated to summer 252.

In some embodiments, system 200 may compare the reference signal to a threshold value, Linear Window Hi limit, at comparator 240. If the reference signal is less than or equal to this threshold, comparator 240 may out put a logical value of one. System 200 may also compare the reference signal to a threshold value, Linear Window Lo limit, at comparator 242. If the reference signal is greater than the threshold, comparator 242 may output a logical value of one. The output of comparators 240, 242 may then be combined at logic circuit 246. In the illustrative example of system 200, logic circuit 246 is an AND gate. In operation, if the outputs of both comparators 240, 242 are a logical value of one, then logic circuit 246 may output a logical value of one.

The output of logic circuit 246 may then be communicated to multiplexer 234. At multiplexer 234, the output of logic circuit 246 may be used to multiplex a one value with the gain error. In some embodiments, this may allow the designer of system 200 flexibility to pick a range of gain error to accommodate. The output of multiplexor 234 is then communicated to averager 250 along with the output of logic circuit 246. Averager 250 may then accumulate the average of the two signals over time. In some embodiments, this average may represent the linear gain error ("LGE"), as described in more detail below with reference to FIGS. 3-4. The LGE may then be communicated to summer 252.

At summer 252, the PGE and LGE values are combined to generate a peak compression estimate value, as described in more detail below with reference to FIGS. 3-4. This peak compression estimate value may then be communicated to comparator 254 and/or baseband processor 202. In some embodiments, comparator 254 may be configured to compare the peak compression value against a number of predetermined thresholds. If the peak compression is above a certain level, comparator 254 may then communicate a compression detect flag to baseband processor 202, as described in more detail below with reference to FIG. 4.

In the same or alternative embodiments, baseband processor 202 may be configured to use the peak compression estimate value to further mitigate the effects of peak compression. For example, baseband processor 202 may use the peak compression estimate value to dynamically alter the thresholds and/or parameters for a compression mitigation algorithm (i.e., a crest factor reduction algorithm or peak-to-average reduction algorithm).

The example system 200 illustrates multiple components as discrete components. In some embodiments, there may be more, fewer, or different components than those depicted in FIG. 2 without departing from the scope of the present disclosure. For example, comparators 236, 238, 240, 242 may all be present on a single integrated circuit. As an additional example, FIG. 2 illustrates comparator 254 generating a compression detect flag and communicating that flag to baseband processor 202. As described in more detail below with reference to FIG. 4, baseband processor 202 may then alter the amplification produced in the transmission chamber to account for the peak compression. However, in the same or alternative embodiments, comparator 254 may communicate the compression detect flag to another component responsible for gain control. For example, comparator 254 may be configured to communicate directly with power amplifier 216, causing a reduction in amplification.

System 200 uses four threshold values to estimate peak compression: Peak Window Hi, Peak Window Lo, Linear Window Hi, and Linear Window Low. As described in more detail below with reference to FIG. 3, these values may be calculated through a windowing technique.

Figure 3:
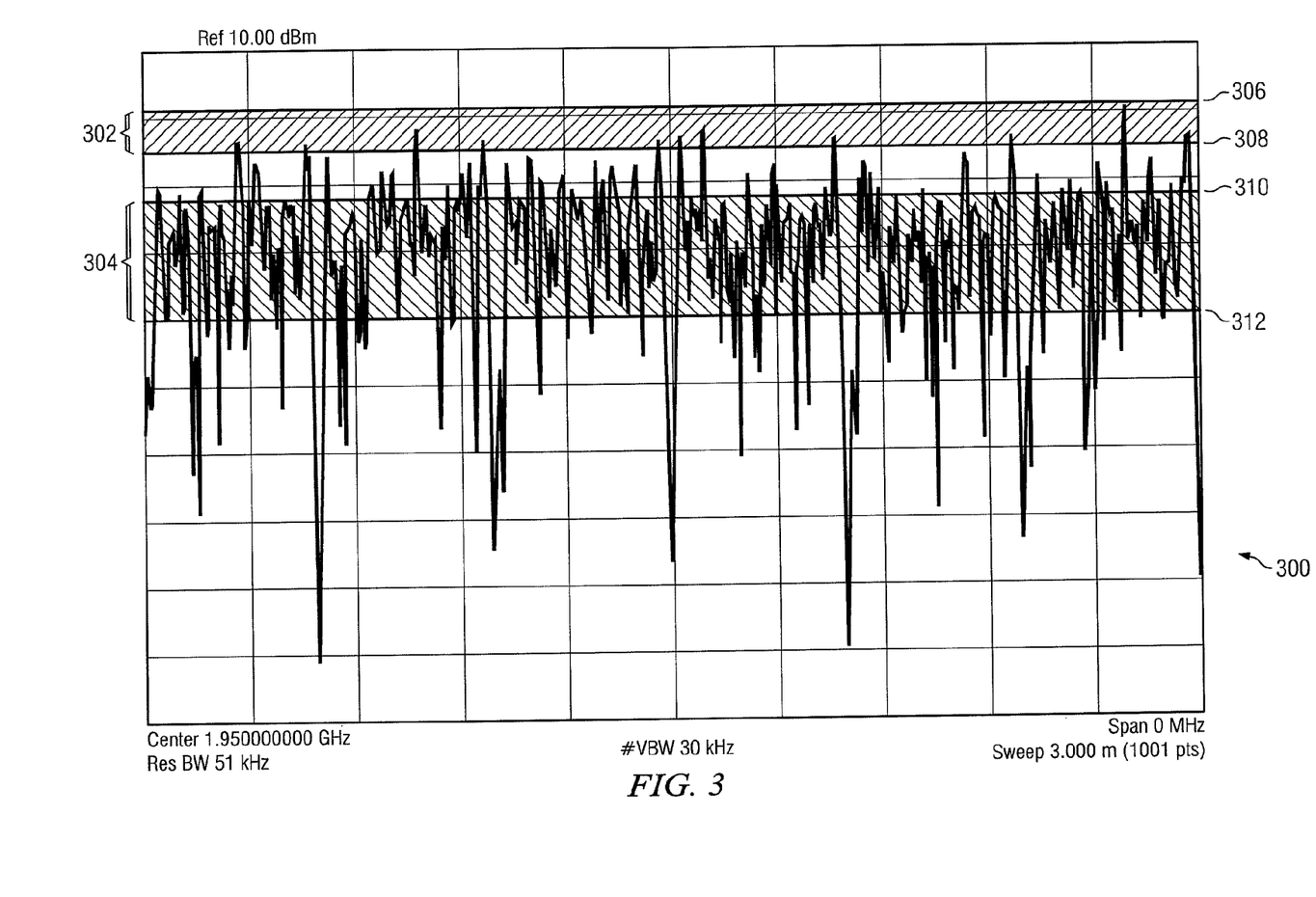
FIG. 3 illustrates an example RF power level present at antenna, in accordance with certain embodiments of the present disclosure.

FIG. 3 illustrates an example RF power level 300 present at antenna 220, in accordance with certain embodiments of the present disclosure. Example RF power level 300 illustrates an example RF signal plotted as power on the y-axis and time on the x-axis. Example RF power level 300 illustrates a signal with a center frequency of 1.95 GHz over 3 ms. Example RF power level 300 also illustrates two windows: peak window 302 and mid window 304. Peak window 302 is associated with a peak window high limit value 306 and a peak window low limit value 308. Mid window 304 is associated with a mid window high limit 310 and a mid window low limit 312. In some embodiments, these values may be used to calculate the threshold values used by system 200 to estimate the peak compression, as described in more detail above with reference to FIG. 2 and below.

In some embodiments, the operating power and the size of the windows may be determined by software, hardware, firmware, and/or some combination thereof. For example, software running on baseband processor 202 may be configured to determine the operating power and window size used to determine the window limit values. In other examples, management software present on another processor may be used to determine these values.

In some embodiments, the window limit values may be calculated as follows:

$$P\text{max}=(\text{Fixed})=24 \text{ dBm} \quad \text{Formula 1}$$

In some embodiments, the value for the maximum peak value (Pmax) may be a fixed value predetermined along with other design parameters of system 200 and may vary depending on the particular configuration of system 200.

$$P\text{ref}=(\text{Fixed, based on modulation}) \quad \text{Formula 2}$$

In some embodiments, the value for the reference peak value (Pref) may be a fixed value depending on the particular type of modulation required by system 200. For example, for a wireless communication device communicating over an LTE network, Pref may be set to −9.2 dB.

$$P\text{out}=(\text{Desired Antenna Power}), \text{from the baseband processor} \quad \text{Formula 3}$$

$$\text{Peak\_Window\_Size}=(\text{Fixed})=2 \text{ dB} \quad \text{Formula 4}$$

$$\text{Mid\_Window\_Size}=(\text{Fixed})=2 \text{ dB} \quad \text{Formula 5}$$

In some embodiments, the peak output power (Pout) may be determined to be the desired antenna power, as determined by the baseband processor. The size of the peak and mid windows are fixed values that may be determined along with other design parameters. For example, system 200 may use a window size of 2 dB. Other configurations may use other values of the window size, depending on design factors such as the tolerance for peak compression and resultant noise.

In some embodiments, the threshold values used by system 200 to estimate peak compression may be calculated from the variables described above, as described in more detail below with reference to Formulas 6-9. As a result, these four threshold values may be calculated.

$$\text{Mid\_Window\_Hi\_Limit} = P\text{out} + \text{Mid\_Window\_Size} \quad \text{Formula 6}$$

$$\text{Mid\_Window\_Lo\_Limit} = P\text{out} - \text{Mid\_Window\_Size} \quad \text{Formula 7}$$

$$\text{Peak\_Window\_Hi\_Limit} = P\text{out} + \text{Peak\_Window\_Size} \quad \text{Formula 8}$$

$$\text{Peak\_Window\_Lo\_Limit} = P\text{out} - \text{Peak\_Window\_Size} \quad \text{Formula 9}$$

In some embodiments, system 200 may also sample the signal within the window to determine a peak window count. The sample rate may vary depending on the configuration of system 200, and may in some embodiments depend on the hardware used and/or the wireless communication protocol desired. For example, system 200 may sample the signal over a 100 microsecond window. In some embodiments, system 200 may then use these sampled values to estimate the peak gain error ("PGE") and/or linear gain error ("LGE").

$$\text{Peak\_Gain\_Error} = \frac{\text{Peak\_Window\_Sum}}{\text{Peak\_Window\_Count}} \quad \text{Formula 10}$$

$$\text{Linear\_Gain\_Error} = \frac{\text{Mid\_Window\_Sum}}{\text{Mid\_Window\_Count}} \quad \text{Formula 11}$$

$$\text{Peak Compression} = (\text{Peak\_Gain\_Error} - \text{Linear\_Gain\_Error}). \quad \text{Formula 12}$$

As described in more detail below with reference to FIG. 4, these values may then be used to estimate the peak compression associated with the signal. In some embodiments, Peak_Gain_Error may be calculated by dividing the sum total of the power of the peaks present within the peak window (Peak_Window_Sum) by the number of peaks present within the peak window (Peak_Window_Count) (i.e., the average). In some embodiments, this may be performed by averager 248 of system 200, as described in more detail above with reference to FIG. 2. In the same or alternative embodiments, Linear_Gain_Error may be calculated by dividing the sum total of the power of the peaks present within the mid window (Mid_Window_Sum) by the number of peaks present within the mid window (Mid_Window_Count) (i.e., the average). In some embodiments, this may be performed by average 250 of system 200, as described in more detail above with reference to FIG. 2. As described in more detail below with reference to FIG. 4, these error values may then be used to determine whether to adjust the output power in order to avoid peak compression.

Figure 4:
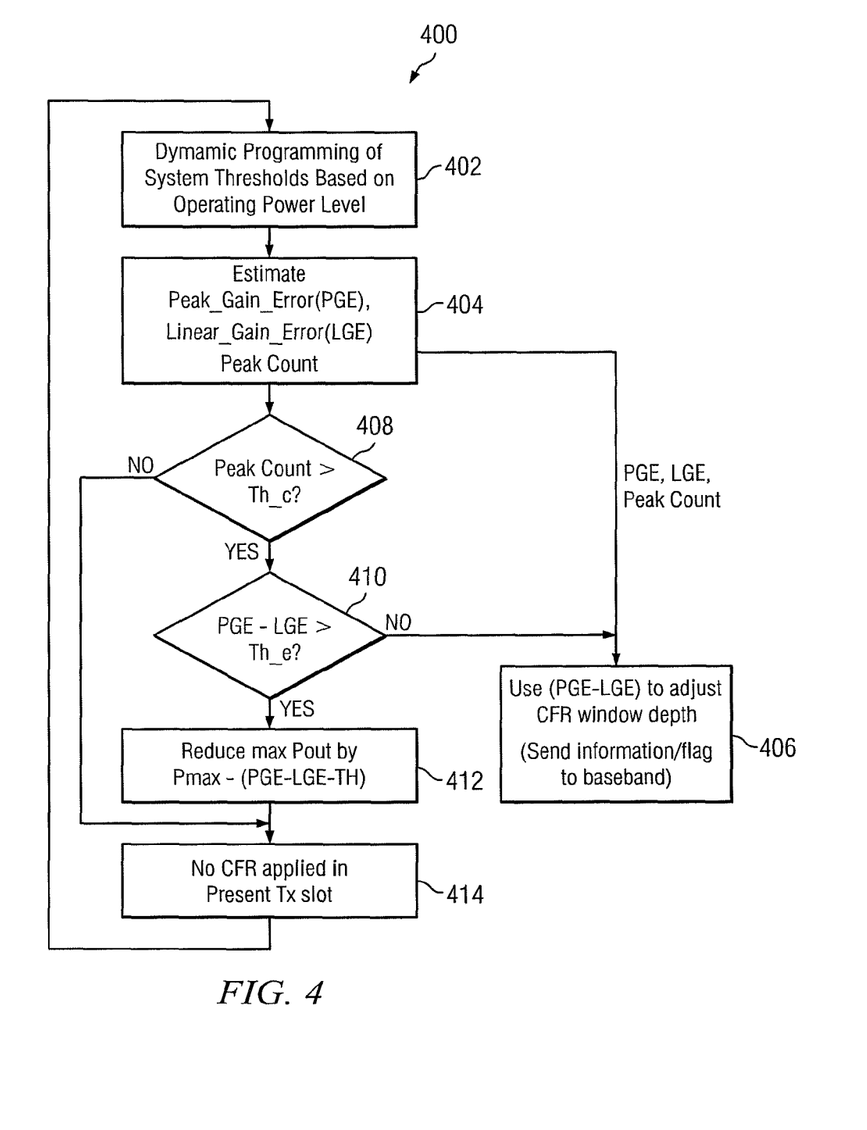
FIG. 4 is a flowchart of an example method for determining whether to adjust the output power of a wireless communication device in order to avoid peak compression of the wireless signal, in accordance with certain embodiments of the present disclosure.

FIG. 4 is a flowchart of an example method 400 for determining whether to adjust the output power of a wireless communication device in order to avoid peak compression of the wireless signal, in accordance with certain embodiments of the present disclosure. In some embodiments, method 400 may include steps 402-14. Although illustrated as discrete steps, various steps may be divided into additional steps, combined into fewer steps, or eliminated, depending on the desired implementation.

In some embodiments, method 400 may begin at step 402, at which dynamic programming of system thresholds occurs. As described in more detail above with reference to FIGS. 2-3, there may be various threshold levels associated with a particular implementation of system 200. In some embodiments, these thresholds may be based on the current operating power level. As described in more detail above with reference to FIG. 3, these initial parameters may then be used to calculate the window threshold values. After programming these threshold values, method 400 may proceed to step 404.

At step 404, method 400 may estimate the Peak_Gain_Error ("PGE"), Linear_Gain_Error ("LGE"), and determine the peak count, as described in more detail above with reference to FIGS. 2-3. After determining these values, method 400 may proceed to steps 406, 408. At step 408, method 400 may determine whether the peak count is greater than a predetermined count threshold ("Th_c"). In some embodiments, this may correspond to a certain activity level within the wireless communication device. For example, it may not be necessary to incur the overhead associated with peak compression estimation unless a certain threshold level of transmission activity is occurring. If the peak count is less than the threshold, method 400 may proceed to step 414, wherein no action is taken to affect the power level and no peak compression mitigation techniques (e.g., crest factor reduction) are implemented. If the peak count is greater than the threshold, method 400 may proceed to step 410.

At step 410, method 400 may determine whether the difference between the PGE and the LGE is greater than an error threshold ("Th_e"). In some embodiments, it may be necessary or desirable to ensure that the difference between the PGE and the LGE is sufficiently large to warrant further processing. For example, if the power levels of system 200 are insufficient to result in peak compression, it may not be necessary or desirable to proceed further. If the difference between the PGE and LGE is not greater than the error threshold, method 400 may proceed to step 406. If the difference is greater, method 400 may proceed to step 412.

At step 406, method 400 may use the PGE, LGE, and peak count values from step 404, along with the error threshold indication from step 408 to adjust the peak compression mitigation techniques. For example, at step 406, method 400 may use the difference between PGE and LGE to adjust the window for a crest factor reduction technique. In the same or alternative embodiments, method 400 may send PGE, LGE, and/or peak count information, along with a compression detect flag to another component of system 200. For example, method 400 may alert baseband processor 202 of system 200 by communicating a compression detect flag. After adjusting peak compression mitigation techniques, method 400 may return to step 402.

If, at step 410, method 400 determined that the difference between the PGE and LGE is greater than the error threshold, method 400 may proceed to step 412. At step 412, method 400 may reduce the maximum output power (Pout) by an appropriate amount to assist in reducing the peak compression. In some embodiments, for example, Pout may be reduced by an amount equal to the difference between the maximum allowed power (Pmax), PGE, the LGE, and the error threshold (Pmax−PGE−LGE−Th_e). In some embodiments, the output power of the antenna may be modified by making modifications to the power amplifier supplying the antenna. In example system 200, for instance, modifications to power amplifier 216 may result in modifications to the output power of antenna 220. Such modifications may include a modification to the amount of amplification performed by power amplifier 216 in order to back off the power supplied to antenna 220. This and other modifications may be performed by altering a bias setting (e.g., current and/or voltage) of power amplifier 216 and/or altering a supply setting (e.g., supply current and/or supply voltage) of power amplifier 216.

Once the output power has been reduced, method 400 may proceed to step 414. At step 414, method 400 may cease peak compression mitigation techniques. For example, in some embodiments, method 400 may cease crest factor reduction techniques. After ceasing these techniques, method 400 may return to step 402.

In some embodiments, the steps of method 400 may be performed by software, hardware, firmware, and/or some combination thereof. For example, the steps of method 400 may be performed by baseband processor 202 of system 200. In other embodiments, different steps may be performed by different components. For example, step 402—programming the system thresholds—may be performed by baseband processor 202 of system 200, while step 410—using the gain error values to adjust mitigation techniques—may be performed by another processor associated with system 200.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. As an illustrative example, method 400 may further include tracking the incident rates of peak compression over time for use in other estimation techniques. As an additional example, other peak compression mitigation techniques may be used that require more, fewer, or different steps than those described for crest factor reduction.

Figure 5:
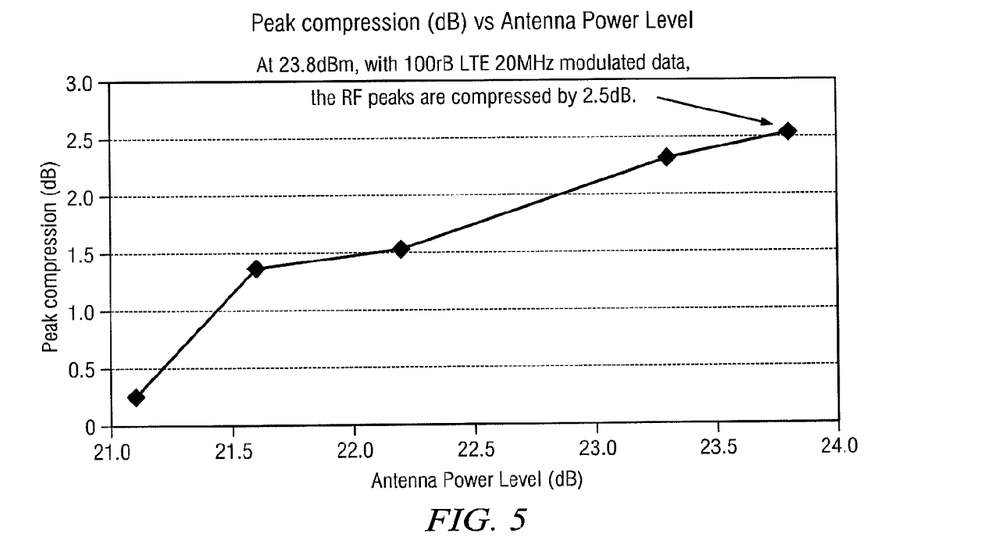
FIG. 5 illustrates a graph in which example peak compression data is plotted against antenna power level, in accordance with certain embodiments of the present disclosure.
Figure 6:
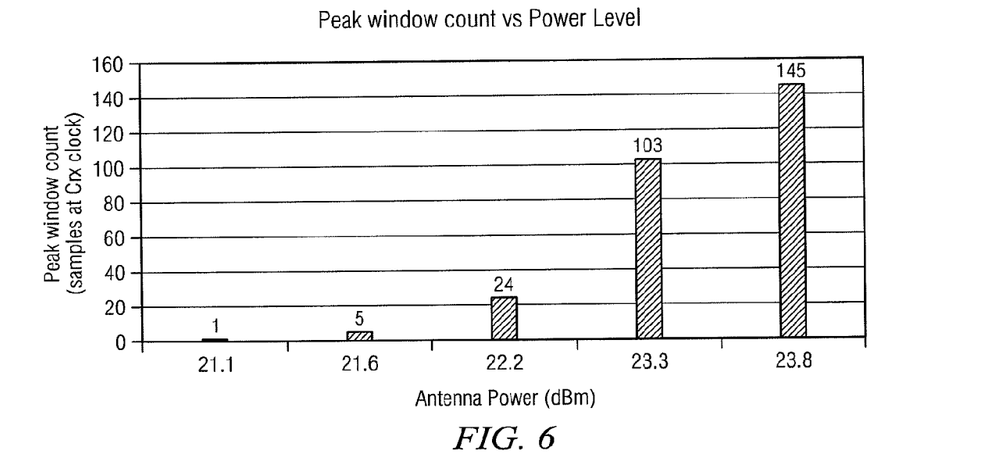
FIG. 6 illustrates a graph in which a count of the number of peaks within the peak window is plotted against antenna power, in accordance with certain embodiments of the present disclosure.

FIGS. 5 and 6 are graphs illustrating an example of data that may be obtained according to the system and method of the previously described illustrative examples. In some embodiments, the example data may be used to provide example system 200 with information that may be used to optimize system performance.

FIG. 5 illustrates a graph in which example peak compression data is plotted against antenna power level, in accordance with certain embodiments of the present disclosure. The graph illustrates that peak compression may increase with antenna power, culminating in a compression of 2.5 dB at an antenna power level of 23.8 dBm. In some embodiments, the peak compression value may be used to dynamically alter the thresholds and/or parameters of a peak compression reduction algorithm, such as a crest factor reduction algorithm. In the same or alternative embodiments, the peak compression value may be used to adjust settings of a wireless communication device in order to reduce peak compression. For instance, example system 200 may be configured to use the peak compression value to adjust settings of power amplifier 216 in order to adjust the power supplied to antenna 220. As described in more detail above with reference to FIGS. 2-4, this may be accomplished by adjusting the bias and/or supply settings to power amplifier 216.

FIG. 6 illustrates a graph in which a count of the number of peaks within the peak window is plotted against antenna power, in accordance with certain embodiments of the present disclosure. This graph illustrates that the number of peaks within the peak window increasers with antenna power, with a measured high of 145 peaks at 23.8 dBm. As described in more detail above with reference to FIGS. 2-4, this information may be used to provide a peak compression estimate value that may be further used to determine whether the supplied power needs to be adjusted. For instance, example system 200 may use the peak error count to estimate a peak gain error value, as described in more detail above with reference to FIG. 2-4.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could me made hereto without departing from the spirit and scope of the invention.

What is claimed is:

1. A system for estimating a peak compression of a wireless signal, the system comprising:
    a reference signal generator configured to provide a reference signal, wherein the reference signal is associated with an ideally amplified and time aligned version of the wireless signal;
    a gain error generator configured to provide a gain error signal, wherein the gain error signal is based at least on the reference signal and the wireless signal; and
    a peak compression estimator configured to provide a compression detection signal based at least on the reference signal and the gain error signal.

2. The system of claim 1, wherein the peak compression estimator is configured to provide the compression detection signal based at least on a plurality of window threshold values, wherein the plurality of window threshold values are based at least on a plurality of programmable window variables.

3. The system of claim 2, wherein the programmable window variable are chosen at least to provide a coherent signal for sampling.

4. The system of claim 1, wherein the peak compression estimator is configured to provide the compression detection signal based at least on a peak gain error value, wherein the peak gain error value is based at least on the reference signal and the gain error signal.

5. The system of claim 1, wherein the peak compression estimator is configured to provide a compression detection signal based at least on a peak gain error value, wherein the peak gain error value is based at least on a plurality of window threshold values, wherein the plurality of window threshold values are based at least on a plurality of programmable window variables.

6. The system of claim 1, wherein the peak compression estimator is configured to provide the compression detection signal lag based at least on a linear gain error value, wherein the linear gain error value is based at least on the reference signal and the gain error signal.

7. The system of claim 1, wherein the peak compression estimator is configured to provide the compression detection signal based at least on a linear gain error value, wherein the linear gain error value is based at least on a plurality of window threshold values, wherein the plurality of window threshold values are based at least on a plurality of programmable window variables.

8. The system of claim 1, wherein the compression detection flag is configured to indicate that peak compression in excess of a predetermined threshold has occurred.

9. The system of claim 1, further comprising:
an antenna;
a power amplifier electrically coupled to the antenna, the power amplifier configured to provide varying levels of amplification; and
an amplification modification module configured to alter the amplification level of the power amplifier based at least on the compression detection signal.

10. The system of claim 9, wherein the amplification modification module is configured to alter the amplification level of the power amplifier by a reduction in a power level of the power amplifier.

11. The system of claim 10, wherein the amplification modification module is configured to alter the amplification level of the power amplifier by adjusting a bias level of the power amplifier.

12. The system of claim 10, wherein the amplification modification module is configured to alter the amplification level of the power amplifier by adjusting a voltage supply level of the power amplifier.

13. The system of claim 1, further comprising:
an antenna; and
an antenna tuner electrically coupled to the antenna, the antenna tuner configured to alter a tuning parameter for the antenna based at least on the compression detection signal.

14. The system of claim 1, wherein the peak compression estimator is further configured to provide a peak compression estimate.

15. The system of claim 14, further comprising a compression mitigation module configured to apply a peak compression mitigation algorithm based at least on the peak compression estimate.

16. The system of claim 15, wherein the peak compression mitigation algorithm comprises a crest factor reduction algorithm.

17. A method for determining whether to adjust the power level of an antenna in a wireless communication device, the method comprising:
determining a plurality of window threshold values, wherein the plurality of window threshold values are based at least on a plurality of programmable window variables;
estimating a peak gain error;
estimating a linear gain error;
calculating a peak count value;
comparing the peak count value to a count threshold value;
comparing a difference between the peak gain error and the linear gain error to an error threshold value; and
if the difference between the peak gain error and the linear gain error is greater than the error threshold value, reducing the output power of the antenna.

18. The method of claim 17, further comprising applying the peak gain error, the linear gain error, and the peak count value to a peak compression mitigation algorithm.

19. The method of claim 18, wherein the peak compression mitigation algorithm comprises a crest factor reduction algorithm.

20. The method of claim 17, wherein estimating the peak gain error comprises calculating an average of the signal peaks within a predetermined peak window.

21. The method of claim 17, wherein estimating the linear gain error comprises calculating an average of the signal peaks within a predetermined mid window.

* * * * *

UNITED STATES PATENT AND TRADEMARK OFFICE
CERTIFICATE OF CORRECTION

| | | |
|---|---|---|
| PATENT NO. | : 8,639,199 B1 | Page 1 of 1 |
| APPLICATION NO. | : 13/594616 | |
| DATED | : January 28, 2014 | |
| INVENTOR(S) | : Pravin Premakanthan et al. | |

It is certified that error appears in the above-identified patent and that said Letters Patent is hereby corrected as shown below:

In the Drawings:

On sheet 4 of 5, in Figure 4, Ref. numeral 402, line 1, delete "Dymamic" and insert -- Dynamic --, therefor.

In the Claims:

In column 10, line 66, in claim 8, delete "flag" and insert -- signal --, therefor.

Signed and Sealed this
Twelfth Day of August, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,639,199 B1
APPLICATION NO. : 13/594616
DATED : January 28, 2014
INVENTOR(S) : Pravin Premakanthan et al.

It is certified that error appears in the above-identified patent and that said Letters Patent is hereby corrected as shown below:

On the title page item (75) Inventor after "Pravin Premakanthan, Chandler, AZ (US)" please delete "Mahib Rahman" insert -- Mahibur Rahman --.

On the title page item (73) Assignee

Delete "McAfee, Inc." and insert -- Intel IP Corporation --.

Signed and Sealed this
Twenty-second Day of March, 2016

Michelle K. Lee
*Director of the United States Patent and Trademark Office*